US 12,324,116 B2

(12) United States Patent
Shigyo

(10) Patent No.: US 12,324,116 B2
(45) Date of Patent: Jun. 3, 2025

(54) ELECTRONIC CONTROL DEVICE AND METHOD FOR MANUFACTURING THE SAME

(71) Applicant: Hitachi Astemo, Ltd., Hitachinaka (JP)

(72) Inventor: Toshikazu Shigyo, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 200 days.

(21) Appl. No.: 18/014,289

(22) PCT Filed: Jun. 22, 2021

(86) PCT No.: PCT/JP2021/023654
§ 371 (c)(1),
(2) Date: Jan. 3, 2023

(87) PCT Pub. No.: WO2022/038891
PCT Pub. Date: Feb. 24, 2022

(65) Prior Publication Data
US 2023/0320013 A1 Oct. 5, 2023

(30) Foreign Application Priority Data
Aug. 18, 2020 (JP) ................ 2020-138229

(51) Int. Cl.
H05K 5/06 (2006.01)
H05K 5/02 (2006.01)
H05K 5/04 (2006.01)
(52) U.S. Cl.
CPC ........... *H05K 5/069* (2013.01); *H05K 5/0252* (2013.01); *H05K 5/04* (2013.01)

(58) Field of Classification Search
CPC ........ H05K 5/069; H05K 5/0252; H05K 5/04; H05K 5/0026; H05K 5/03; H05K 5/06; C25D 5/10; C23C 22/00; C23C 2/06
See application file for complete search history.

(56) References Cited

U.S. PATENT DOCUMENTS

2002/0031672 A1  3/2002  Eguchi et al.
2008/0002377 A1  1/2008  Kamoshida et al.
(Continued)

FOREIGN PATENT DOCUMENTS

ES      2401018 B1 * 12/2013  ............. B21J 5/066
JP      2002-76205 A    3/2002
(Continued)

OTHER PUBLICATIONS

Inspection of Metals (Year: 2013), F.C. Campbell editor.*
(Continued)

*Primary Examiner* — Sagar Shrestha
*Assistant Examiner* — Peter Krim
(74) *Attorney, Agent, or Firm* — Crowell & Moring LLP

(57) ABSTRACT

An electronic control device (1) includes a cover (30) (housing). The cover (30) (housing) includes at least a metal layer (32), a plating layer (33), an exposed site (32a), and a seal tape (70) (lid portion). That is, the cover (30) housing includes a metal layer (32) made of metal, a plating layer (33) that coats an outer surface of the metal layer (32), an exposed site (32a) that exposes the metal layer (32) from a part of the plating layer (33), and a seal tape (70) (lid portion) that covers the metal layer (32) exposed by the exposed site (32a).

12 Claims, 8 Drawing Sheets

(56) References Cited

U.S. PATENT DOCUMENTS

| | | | | |
|---|---|---|---|---|
| 2013/0069320 | A1* | 3/2013 | Yanagisawa | H05K 5/0082 |
| | | | | 277/628 |
| 2013/0160898 | A1* | 6/2013 | Matsuno | C23C 28/00 |
| | | | | 148/253 |
| 2015/0305172 | A1* | 10/2015 | Guarneros Jones | H05K 5/0056 |
| | | | | 361/752 |
| 2018/0222408 | A1* | 8/2018 | Shigyo | B60R 16/0239 |
| 2019/0032222 | A1* | 1/2019 | Marmann | C23C 22/361 |
| 2019/0060839 | A1 | 2/2019 | Banju et al. | |
| 2021/0348631 | A1 | 11/2021 | Yakuzawa et al. | |

FOREIGN PATENT DOCUMENTS

| | | |
|---|---|---|
| JP | 2008-8210 A | 1/2008 |
| JP | 2017-136839 A | 8/2017 |
| JP | 6488391 B2 | 3/2019 |
| WO | WO 2017/199569 A1 | 11/2017 |
| WO | WO 2018/173928 A1 | 9/2018 |
| WO | WO 2020/050093 A1 | 3/2020 |

OTHER PUBLICATIONS

ASM International, F.C. Campbell editor "Inspection of Metals" 2013, Karen Marken (listed publisher) (Year: 2013).*

International Search Report (PCT/ISA/210) issued in PCT Application No. PCT/JP2021/023654 dated Sep. 21, 2021 with English translation (five (5) pages).

Japanese-language Written Opinion (PCT/ISA/237) issued in PCT Application No. PCT/JP2021/023654 dated Sep. 21, 2021 (three (3) pages).

* cited by examiner

A-A

B-B

ELECTRONIC CONTROL DEVICE AND METHOD FOR MANUFACTURING THE SAME

TECHNICAL FIELD

The present invention relates to an electronic control device and a manufacturing method.

BACKGROUND ART

As an electronic control device mounted in an engine room, environmental resistance specification conditions that are severe against corrosion and deterioration and a long life are required. In particular, it is required to increase the life of salt damage resistance of salt water or the like. There is a demand for a completely airtight seal structure that protects a printed wiring board on which electronic components and the like are mounted with a housing and does not induce pressure inside an in-vehicle electronic control device to be positive-negative pressure toward a vehicle harness side via a connector. A very high withstand pressure of 50 kPa to 85 kPa is also required in consideration of air transportation with pressure change.

In addition, an increase in the size of the housing and a multipolarization of the number of connector poles due to an increase in the functionality of the electronic control device have progressed beyond the technical progress of miniaturization of electronic components mounted on a board and miniaturization of a mounting structure. Dispersion of the electronic control device and wireless in the reduction of the number of terminal poles of the connector cannot be easily realized by an electronic control device for an engine mounted in an engine room or an electronic control device for a transmission.

Unlike general-purpose products, long-life seal adhesive material used in the engine room is generally expensive. It is necessary to secure a sealing length and an adhesive force that can withstand complete airtightness and high withstand pressure while reducing the usage amount of the sealing material including variations in work and assembly.

A housing of an electronic control device is also required to suppress electromagnetic noise radiated from an electronic component, a printed wiring board, or the like and to have noise resistance to protect against external electromagnetic noise.

There is a demand for a high degree of freedom in attachment that is not limited to a mounting position on a vehicle. As a mounting and fixing method to a vehicle, a method of providing a flange or the like in an electronic control device, providing a through-hole in the flange or the like, and fixing to a fixing member on a vehicle side with a bolt has been common, but in recent years, as a method of simplifying work and not fixing with a bolt with reduced cost, a method of sandwiching and fixing a housing of an in-vehicle electronic control device with a resin bracket or the like provided on the vehicle side has been increasing.

Conventionally, PTLs 1 to 4 are known as electronic control devices.

PTL 1 is a highly functional in-vehicle electronic control device mounted in an engine room, and is characterized in that a gap between a case and a cover is filled with a seal adhesive material, and an outer peripheral side gap and an inner peripheral side gap are always filled with the seal adhesive material.

PTL 2 is a control device sealed with a silicone gel, and the silicone gel is applied and heated and cured. Pressure guide holes are provided for outgas generated when the silicone material is cured to discharge the gas and make the pressure constant.

In PTL 3, the cover is fastened and fixed to the case body with a set screw. A convex portion is provided in a protruding manner from an upper end portion of the fastening and fixing portion of the case body, and a cutout groove for air bleeding is provided in the convex portion, so that outgas of the waterproofing adhesive cured by temperature rise of about 100° C. for one hour is discharged.

In PTL 4, plating is partially peeled off from the inner side of a cover that protects a printed wiring board on which an electronic component or the like is mounted to expose a base material of a steel plate, causing a sealing material to enter an exposed portion. The cover is a rolled iron-based material, the base material is hot-dip galvanized with a thickness of several tens of um, and the surface of the plating is further subjected to a chemical conversion treatment with a thickness of several um. In addition, an outgas discharge portion is provided to discharge an outgas generated at the time of curing the sealing material.

CITATION LIST

Patent Literature

PTL 1: JP 6488391 A
PTL 2: JP 2002-76205 A
PTL 3: JP 2008-8210 A
PTL 4: WO 2020/050093
PTL 5: WO 2017/199569

SUMMARY OF INVENTION

Technical Problem

A problem to be solved is that in the conventional structure of PTL 1 or PTL 4, a gap between a case and a cover is filled with a sealing material to be completely airtight. Before assembling the cover, it is not assumed that the cover is stored for a long time and the surface of the cover is oxidized. Furthermore, even if the surface of the cover starts to oxidize immediately after the assembly, an adhesive force that can withstand a change in pressure of 65 kPa to 85 kPa can be secured, but when moisture or temperature is applied to the sealing portion, the adhesive force decreases at the interface between the cover surface and the sealing material, and peeling off of the sealing material occurs.

The hot-dip galvanized steel plate of the material of the cover is mainly composed of three layers, where the iron-based substrate material is plated with zinc, aluminum, magnesium, or the like by several tens of micrometers (um), and the outermost surface is further subjected to an inorganic or organic chemical conversion treatment by several um, but if the steel sheet is stored for a long time after the cover molding, the chemical conversion treatment is lost, and an oxide film is formed on the plated portion. However, the galvanized surface is slightly different from the white color of white rust and blackened black color, but cannot be visually determined with a microscope or the like. Oxidation affects a decrease in adhesive strength between the adherend and the seal adhesive, and thus it is necessary to be able to identify the color of the cover.

Further, it is necessary to check the withstand pressure when inspecting whether or not the oxidized cover can be assembled. When the withstand pressure fails after the assembly, the in-vehicle electronic control device becomes difficult to repair and thus needs to be discarded. Furthermore, it is also difficult to store a large cover of an in-vehicle electronic control device having a high functionality in a moisture-proof container such as a desiccator so as not to oxidize the cover after molding.

In addition, in the conventional structures of PTLs 1 to 4, it is necessary to discharge the outgas in the silicone-based seal adhesive cured by raising the temperature, and in PTL 1 or PTL 4 and the completely airtight in-vehicle electronic control device, a pressure guide hole and an air vent hole are provided to discharge the outgas after the seal adhesive is cured. Note that it is a general configuration to seal the hole for discharging the outgas with a cap, a seal tape, a label, or the like to make the hole completely airtight, but a configuration to seal a site for determining the oxidation state is not known.

Furthermore, in the conventional structure of PTL 4, it is necessary to scrape the plating of the screw peripheral portion on the inner side of the cover to expose the substrate, and to prevent foreign matter from falling onto the printed wiring board before assembly.

PTL 5 is a corrosion resistance diagnosis device for an outdoor unit of an air conditioner, in which a thickness of a corrosion product generated on a metal thin film is obtained by using a difference in color between the metal thin film and the corrosion product to be generated, thereby diagnosing a corrosion progress state, but an oxidation detection unit is provided separately from a product, and a detection unit is not provided in the product.

An object of the present invention is to provide an electronic control device capable of easily checking an oxidation state of a housing.

Solution to Problem

In order to achieve the above object, an example of the present invention is an electronic control device including a housing, in which the housing includes a metal layer made of metal, a plating layer that coats an outer surface of the metal layer, an exposed site that exposes the metal layer from a part of the plating layer, and a lid portion that covers the metal layer exposed by the exposed site.

Advantageous Effects of Invention

According to the present invention, the oxidation state of the housing can be easily checked. Problems, configurations, and effects other than those described above will be clarified by the description of the following embodiments.

DESCRIPTION OF EMBODIMENTS

Hereinafter, embodiments for carrying out the present invention will be specifically described with reference to examples, but the present invention is not limited to the following examples. The present embodiment relates to, with respect to an electronic control device that accommodates a printed wiring board on which electronic components and the like are mounted, an electronic control device for an automobile (in-vehicle electronic control device) that mounts a metal material having excellent environmental resistance and pressure resistance, such as salt water, in an engine room in which the presence or absence of oxidation can be visually confirmed before assembly and complete airtight waterproofness that does not affect adhesiveness to a seal adhesive material is secured.

Example

Figure 1:
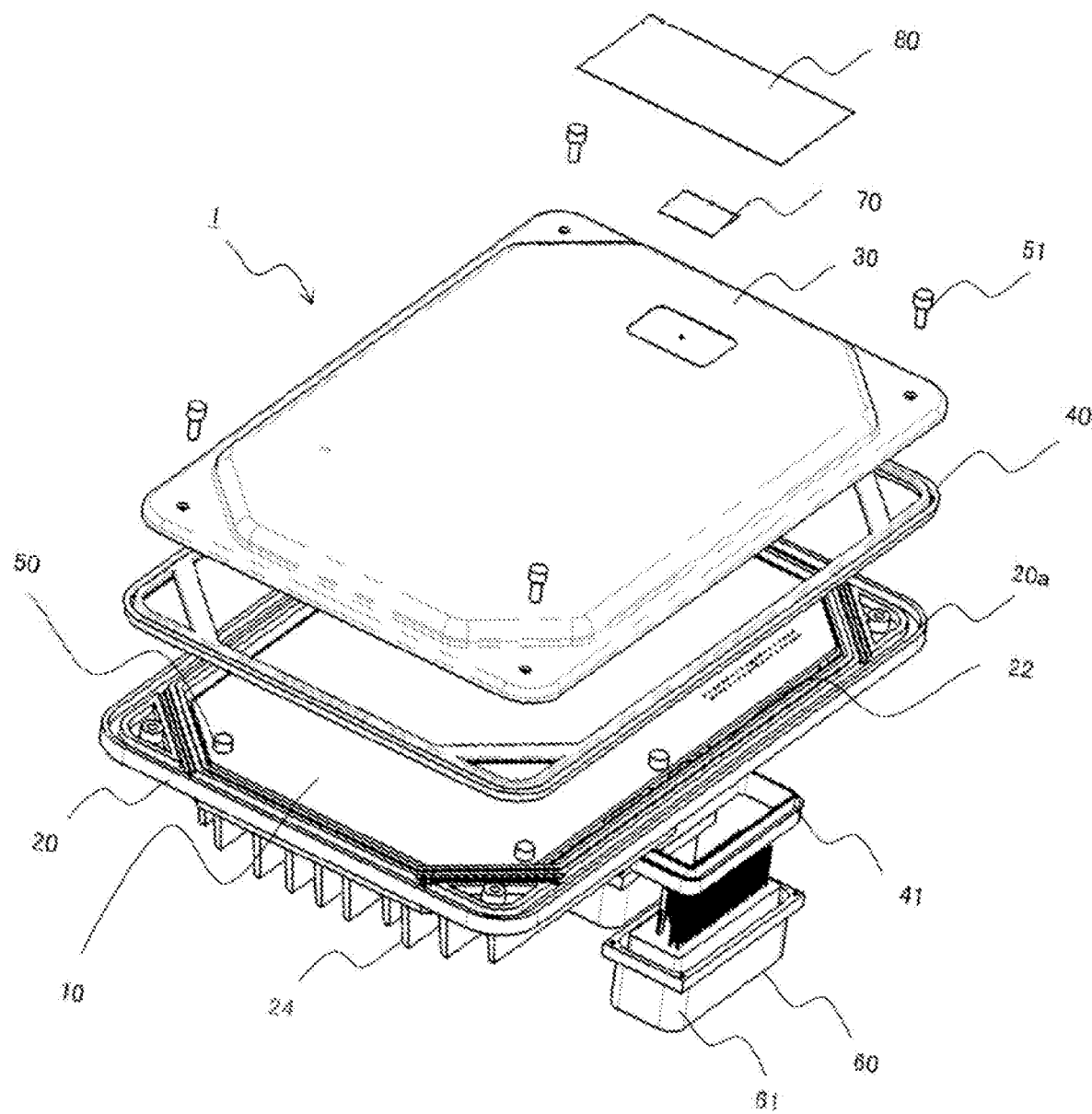
FIG. 1 is a perspective view of an electronic control device according to the present example.
Figure 2:
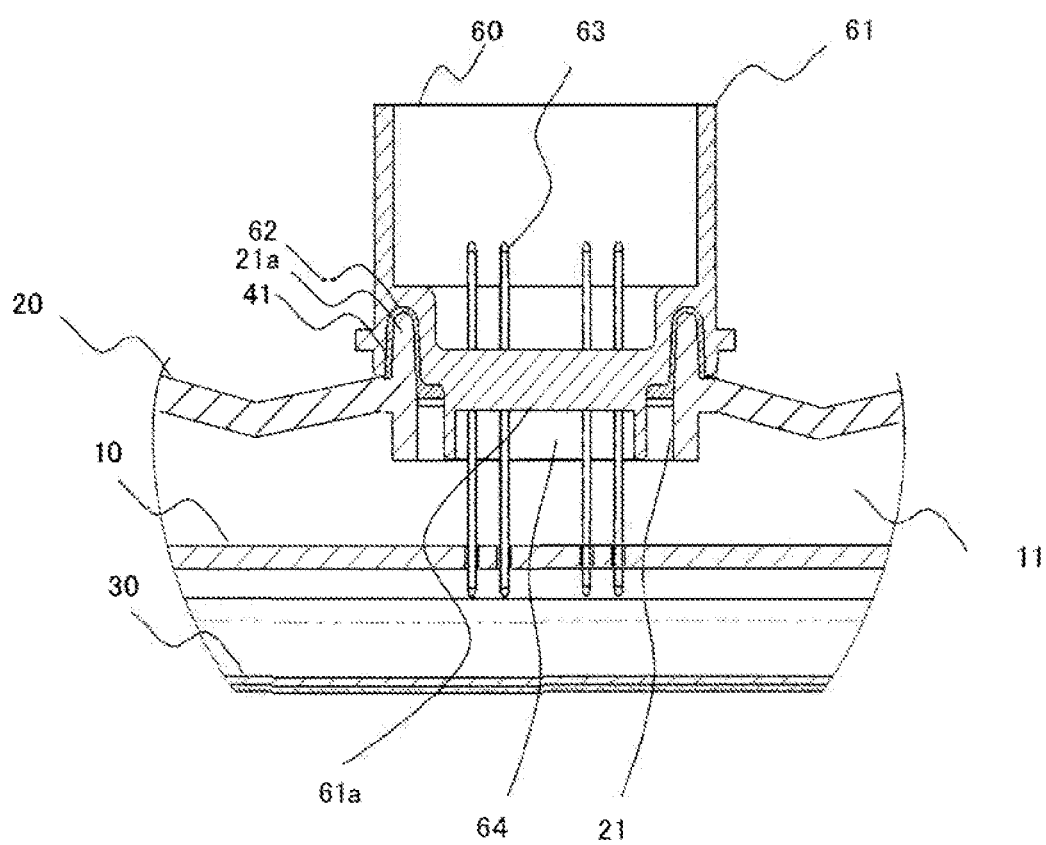
FIG. 2 is a cross-sectional view of a main part of the electronic control device illustrated in FIG. 1.
Figure 3:
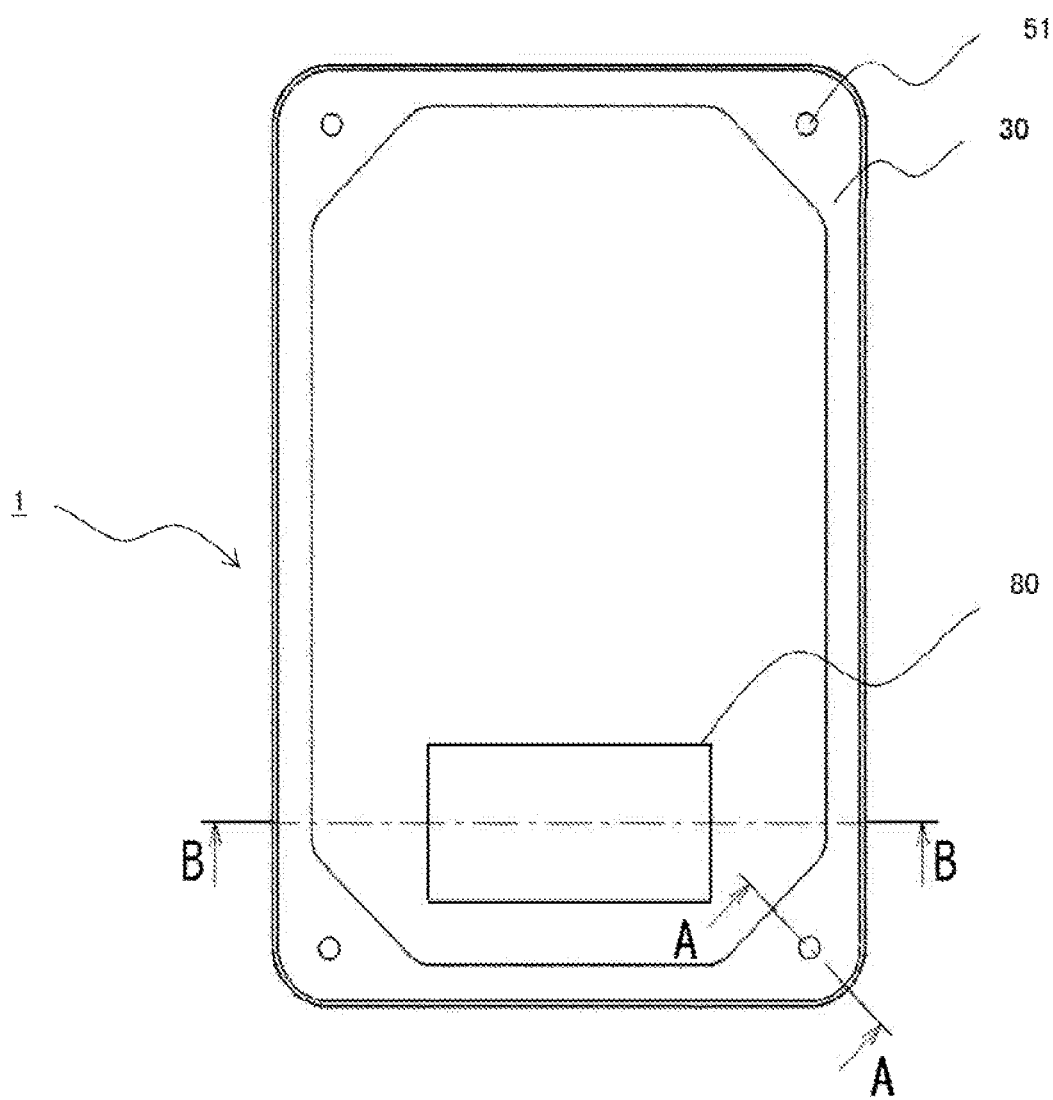
FIG. 3 is a plan view of the electronic control device illustrated in FIG. 1.
Figure 4:
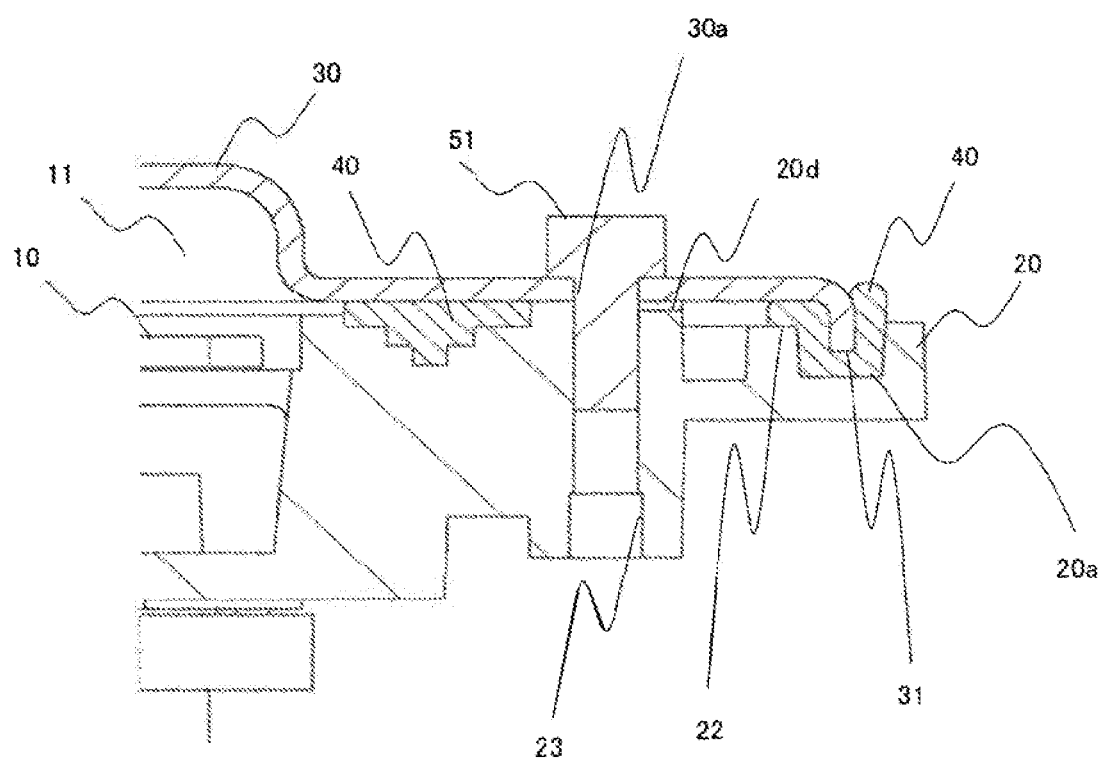
FIG. 4 is a cross-sectional view (A-A) of a main part of the electronic control device illustrated in FIG. 3.
Figure 5:
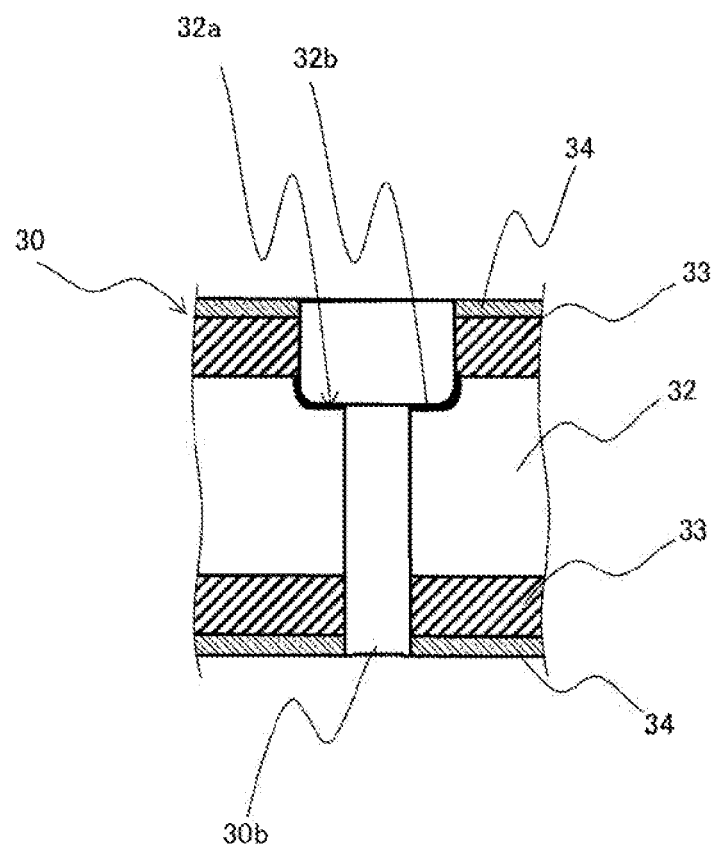
FIG. 5 is a cross-sectional view (B-B) of a main part of a cover illustrated in FIG. 3.
Figure 6:
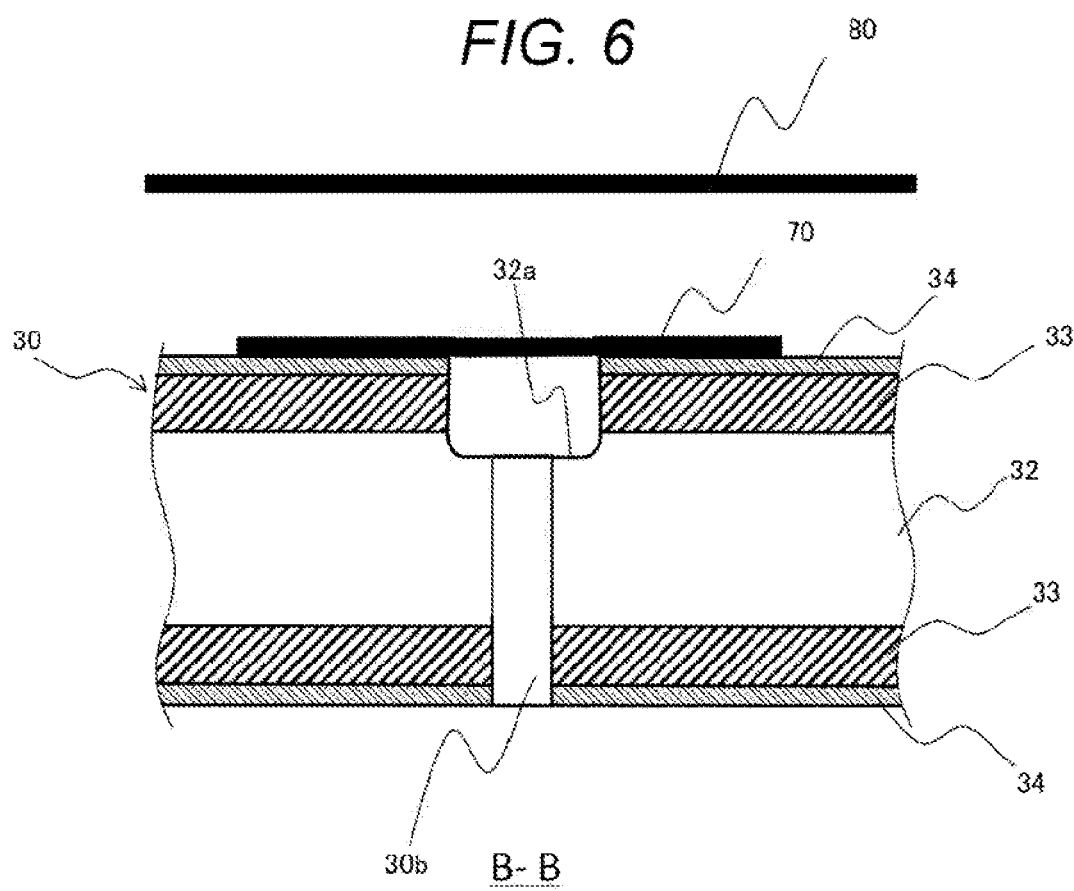
FIG. 6 is a cross-sectional view (B-B) of a main part in the middle of assembly of the electronic control device illustrated in FIG. 3.

FIG. 1 is a perspective view illustrating an electronic control device according to the present example. In order to make the drawings easier to see, electronic components and the like mounted on the board are omitted. FIG. 2 is a cross-sectional view of a main part illustrating the electronic control device according to the present example. FIG. 3 is a plan view illustrating the electronic control device according to the present example. FIG. 4 is a cross-sectional view of a main part taken along line A-A illustrating the electronic control device illustrated in FIG. 3. FIG. 5 is a cross-sectional view of a main part taken along line B-B of a cover illustrated in FIG. 3. FIG. 6 is a cross-sectional view of a main part taken along line B-B in the middle of assembling the cover illustrated in FIG. 3 (before attaching a label).

As illustrated in FIG. 1, an electronic control device 1 is configured by a printed wiring board 10 on which electronic components and the like (not illustrated) are mounted, a case 20 that protects the printed wiring board 10, a cover 30 that seals a pair of internal spaces 11 (FIG. 2), a connector 60 connected to the printed wiring board 10, a sealing material 40 that waterproofs between the case and the cover, a sealing material 41 that waterproofs between a housing 61 of the connector 60 and convex portions 21*a* at the periphery of a plurality of frontages penetrating the case 20, a heat dissipation adhesive (not illustrated) provided between the printed wiring board 10 and the case 20, a screw 50 that fixes the printed wiring board 10 to the case 20, and a screw 51 that fixes the case 20 and the cover 30.

The case 20 interiorly accommodates the printed wiring board 10 with the cover 30, and protects the printed wiring board 10 on which the electronic components are mounted from water, foreign matters, and the like. The case 20 is preferably made of metal and suitably made of aluminum in order to dissipate heat generated by the electronic component and to shield noise. In particular, in the electronic control device 1 for a direct injection engine, a shielding effect is required.

The case 20 is molded by an aluminum die casting molding method using a mold. In the case of an electronic control device including an electronic component that does not require heat dissipation or shielding, the material of the case 20 may be resin. In the case of resin, the case 20 is molded by an injection molding method. The outer shape of the electronic control device is about 240 mm×160 mm, and is relatively large in size among the electronic control device 1 disposed in the engine room, and is rectangular in shape. In PTL 3, the size is about 160 mm×160 mm, and the present example has a size of greater than or equal to 1.5 times the size in PTL 3.

The case 20 is provided with the frontage 21 (FIG. 2) penetrating therethrough, which frontage 21 has a function of penetrating the connector. Under an environment where an automobile is transported or used, such as an altitude change or a temperature change, a pressure is applied to the inside of the case 20, and the central portion of the case 20 is deformed in the concave-convex direction to the maximum extent, and hence it is preferable that the penetrating frontage 21 is located on the outer side from the center of the case. A heat dissipation fin 24 that increases heat capacity is provided on the opposite side of the frontage 21. That is, the frontage 21 is disposed on one short side of the case 20, and the heat dissipation fin 24 is disposed on the other short side of the case 20. As illustrated in FIG. 1, the direction of the heat dissipation fin 24 is parallel to the long side of the case 20, but may be parallel to the short side of the case 20. It is desirable to be parallel to the gate at the time of molding by the aluminum die casting molding method.

In the aluminum die casting molding method, molding needs to be performed within the time during which aluminum solidifies by fluid analysis or the like, and the position of the gate, the arrangement of the overflow, the entrainment of air, and the flow of hot water are confirmed in advance. When hot water flow is poor and there is a molding defect such as a nest or a weld mark, deterioration of heat conduction or cracks may occur, and hence the thickness is set so as not to affect not only airtightness and deformation but also strength and appearance.

As illustrated in FIG. 4, the case 20 is provided with a peripheral edge groove 20a over the entire periphery of the cover 30, and has a shape 22 on the internal space side with respect to the sealing material 40 to prevent and suppress the movement of the sealing material 40 toward the internal space. The shape 22 is set to be higher than the peripheral edge groove 20a. The shape 22 also needs to secure a clearance that does not come into contact with the printed wiring board 10. In addition, the case 20 is subjected to a surface roughening treatment by shot blasting or the like in order to suppress the movement of the sealing material 40. In particular, when the peripheral edge groove 20a to which the sealing material 40 is applied and the surface roughness around the shape 22 are increased, the movement of the sealing material 40 can be suppressed. Since the sealing material 40 is not on the internal space side but on the outer side, crevice corrosion due to electrolytic corrosion does not progress.

The case 20 has a plurality of pedestals for fixing the printed wiring board 10, and is provided with a pedestal (not illustrated) on which tapping is performed for tightening the screw 50 (FIG. 1) and a pedestal having surface accuracy to which a heat dissipation adhesive material (not illustrated) is applied. The case 20 is also provided with a pedestal that is fixed to the cover 30 by way of a screw 51 (FIG. 4).

The cover 30 is provided with an end portion 31 over the entire periphery of the cover 30, and the sealing material 40 is applied between the cover and the peripheral edge groove 20a of the case 20 to protect foreign matters such as salt water required in environmental specifications of the engine room.

The material of the cover 30 is preferably an iron-based or aluminum-based steel plate, but may be resin or aluminum die casting. Metal does not affect electromagnetic waves. Alternatively, it is not affected by electromagnetic waves more than others. The rolled base material is preferably an iron-based base material.

Although details will be described later, in the present example, the material of the cover 30 is an iron-based steel plate to provide the exposed site 32a, which is one of the features, in the cover 30 (housing). However, the exposed site 32a may be provided in the case 20 (housing). In this case, the material of the cover 30 is not limited to an iron-based material, and may be a resin.

The cover 30 is preferably a steel plate having a constant plate thickness, and is molded by a press-molding method. In the case of a steel plate, it is more preferable if it is plated on the metal layer 32. The plating layer 33 is mainly composed of molten zinc, and is plated with high corrosion resistance in an engine room environment containing impurities such as zinc, aluminum, and magnesium.

The thickness of the plating layer 33 is about several tens um. When the plating layer 33 is thick, the plating layer 33 is easily cracked, but corrosion resistance is high.

On the outermost surface of the plating layer 33, an inorganic or organic chemical conversion treatment is performed as primary corrosion prevention for oxidation prevention of plating. That is, the cover 30 (housing) includes a chemical conversion treatment layer 34 that coats the outer surface of the plating layer 33. The thickness of the chemical conversion treatment layer 34 is several hundred nm.

In the case of a pre-plated steel plate (steel plate plated before molding), there is no plating on the cut surface at the time of molding, and hence an end portion 31 is buried in the sealing material 40 or the like to protect the corrosion of the end portion 31. The clearance between the end portion 31 and the peripheral edge groove 20a sufficiently ensures a thickness capable of maintaining the adhesive force of the sealing material 40. The sealing material 40 is adhered in parallel with the flat portion to sandwich the entire periphery together with the case 20. A creeping distance for corrosion can be secured as the distance of the sealing material 40 increases.

Electronic components and the like are mounted on the printed wiring board 10 using a conductive alloy such as solder. It can also be mounted on both sides. The electronic components are passive components such as resistors and capacitors and active components such as semiconductors, and are mounted on a printed wiring board through a surface mounting method or an insertion mounting method. It is desirable to adopt a long-life electronic component that can withstand an engine room environment for automobiles.

As a package of an electronic component, a high density ball grid array (BGA) or quad for non-lead package (QFN) is mounted together with a quad flat package (QFP) in which a lead terminal is extended in order to increase a mounting density. The BGA has electrodes formed in a hemispherical shape by surface tension of a conductive alloy to terminals arranged in a lattice form on a bottom surface of the package, and is joined to the printed wiring board 10 by reflow. The terminal of the QFN is shorter than that of the QFP, and the QFN is connected to the printed wiring board 10 by a conductive alloy. When the deformation amount of the printed wiring board 10 is large, the joining portion has a structure susceptible to stress, and the deformation amount of the printed wiring board 10 needs to be suppressed.

The printed wiring board 10 is fixed to the tapped pedestal of the case 20 together with the plurality of screws 50. At this time, it is fixed to the printed wiring board 10 and the pedestals having surface accuracy of the case 20 so as to sandwich the heat dissipation adhesive therebetween, where heat generated from the electronic component is transferred to the pedestals through the vias of the printed wiring board, and the heat is transferred from the surface of the case 20 including the fins.

The height position of the printed wiring board 10 is desirably at the center of the case 20 and the cover 30. When the electronic component is shifted to either side, a height of an electronic component to be mounted is limited, and a tall electronic component cannot be disposed on both sides. In addition, since the height position of the printed wiring board 10 is at the center of the case 20 and the cover 30, the height of the electronic control device 1 can be reduced. By making the electronic control device 1 low in height, it is possible to easily secure a space and easily receive wind for cooling by mounting it in an engine room.

Since it is relatively large in size in the electronic control device 1 disposed in the engine room, four to seven screws 50 are fixed. With regard to the positions of the screws 50, they are desirably arranged with the distances between the screws made equal while considering the four corners of the printed wiring board 10 and the arrangement of the electronic components. In particular, since strain is generated in the printed wiring board 10 in the vicinity of the screw 50, arrangement that does not generate strain in the connector 60 and a joining portion made of a conductive alloy such as BGA or QFN is desirable, and the arrangement in the vicinity is avoided. Furthermore, the screw 50 has a function as a case earth, and conduct the GND wiring pattern of the printed wiring board 10 and the case 20 through the screw 50. The case earth is desirably located at four corners of the printed wiring board 10 in guiding the wiring pattern of the printed wiring board 10.

The printed wiring board 10 is suitably a glass epoxy board in which an epoxy resin is impregnated into a stack of glass fiber fabrics, and is a multilayer board in which an insulating body and a pattern are stacked, and is a multilayer board of four to eight layers as high density mounting is required. In addition, a through plate for wiring between layers with a penetrating through-hole or a build-up plate by a build-up method is suitable.

The heat dissipation adhesive conducts heat generation of the electronic component to the pedestal having surface accuracy of the case 20 through the via of the printed wiring board. Heat generation is more easily conducted the thinner the thickness of the heat dissipation adhesive. When the case 20 is deformed to the mountain side, the clearance with the printed wiring board 10 is widened, and thus the heat dissipation performance is deteriorated, so that it is effective to suppress the deformation of the case 20. The heat generating electronic component that requires heat dissipation is disposed below the heat dissipation fins 24.

As illustrated in FIG. 2, the connector 60 includes a housing 61, a terminal 63, and a potting material 64. The terminal 63 is press-molded using a copper-based material having high heat conductivity. The shape of the terminal 63 is a straight line, is easily guided to the connector on the harness side or the through-hole of the printed wiring board, and is provided with a crush at the distal end. The housing 61 is molded of resin by injection molding, and the terminal 63 is press-fitted into the housing 61. Alternatively, insert molding may be performed simultaneously with the terminal 63.

The housing 61 is provided with a recessed shape 61a that encloses the potting material 64. Since there is a gap between the housing 61 and the terminal 63 press-fitted into the housing 61, the potting material 64 is provided for the purpose of airtightness. The withstand pressure of the potting material 64 enclosed in the recessed shape 61a requires a thickness and an adhesive force that can withstand a pressure of about 50 kPa to 85 kPa.

The size of the connector 60 depends on the number of poles of the terminal 63 and the width of the terminal 63. The terminal 63 has both the signal terminal and the power terminal due to a difference in current capacity, and the number of poles is about 60 to 80 in total. The power terminal is wider. The terminal 63 and the penetrating through-hole of the printed wiring board 10 are connected using a conductive alloy (not illustrated) such as solder. In addition, they may be mechanically and electrically connected by a press-fit terminal (not illustrated).

In the assembly of the connector 60 of the present example, it is connected to the outer side of the frontage 21 of the case 20 through the sealing material 41, but may be first connected to the printed wiring board 10, and then connected to the inner surface side of the frontage 21 of the case 20 through the sealing material 41. Connecting the connector 60 from the outer side of the frontage 21 of the case 20 is advantageous in that the seal structure of the connector 60 can be miniaturized.

In a detailed method of connecting the connector 60 to the case 20, the housing groove 62 in which the sealing material 41 is buried is provided at the periphery of the housing bottom side of the connector 60, the convex portion 21a of the frontage of the case is fitted, and the sealing material 41 is cured and sealed. A labyrinth structure is formed by the depth of the housing groove 62 and the height of the convex portion 21a of the frontage of the case to protect from foreign matters such as salt water required in environmental specifications of the engine room.

Since the clearance between the housing groove 62 and the convex portion 21a of the frontage of the case is filled with the sealing material 41, the clearance and the amount of sealing material 41 are determined in consideration of an assembly error. For example, when the inside of the case expands and deforms to the mountain side due to the influence of heat and pressure at the peripheral portion of the connector of the case 20, the sealing material 41 functions as a buffer material, but the connector 60 also deforms at the same time since the clearance is small. The deformation of the connector 60 also affects the terminal 63, and the deformation is simultaneously transmitted to the printed wiring board 10 through the conductive adhesive.

The sealing material 41 is preferably a silicone adhesive having heat resistance, water resistance, chemical resistance, and flexibility in order to protect from foreign matters such as salt water required in environmental specifications of an engine room.

Similarly to the sealing material 41, the sealing material 40 is suitably a silicone adhesive. The withstand pressure requires a thickness and an adhesive force that can withstand a pressure of about 50 kPa to 85 kPa. In particular, the long side of the case 20 is deformed such that an internal pressure is applied to the case 20 and the center of the case 20 is curved toward a mountain side in a pressure change in the case 20 due to a temperature change, and thus the center of the long side is deformed the most. Therefore, the sealing material 40 has an adhesive force that can withstand deformation.

As illustrated in FIG. 4, the cover 30 is provided with through-holes 30a, through which screws 51 to be fixed to case 20 pass, at four corners. The cover 30 and the case 20 are fixed together by the screw 51 with the sealing material 40. The screws 51 are desirably arranged at four corners so that the application locus of the sealing material 40 does not become complex. In the present example, since the size is 1.5 times larger than that of the conventional electronic control device, a thin material is selected for the cover 30, but ribs, dimples, steps, and the like are provided to secure strength.

In order to fit the case 20 and the cover 30, the screw 51 is passed through the through-hole 23 on the case side and the through-hole 30a on the cover side provided respectively. The through-hole 23 on the case side is tapped. In order to prevent loosening, a spring washer and a flat washer may be sandwiched between the screws 51.

The material of the sealing material is suitably a silicone-based adhesive, and may be an addition type that is cured by applying heat or a condensation type that is cured by moisture. The addition type that is cured by applying heat is suitably cured at 100° C. to 110° C. for a curing time of 60 minutes or longer.

The potting material 64 that airtightly seals the terminals 63 and the housing 61 of the connector, the sealing material 41 that airtightly seals the circumference of the connector, the sealing material 40 that airtightly seals the entire periphery of the case and the cover, and the internal space 11 in which the printed wiring board 10 of the electronic control device 1 is disposed are completely sealed.

After the cover is mounted, the sealing material 40 and the sealing material 41 can be simultaneously cured. However, in order to discharge the generated outgas when simultaneously curing the sealing material 40 and the sealing material 41, for example, a plurality of outgas discharge portions such as the through-hole 23 on the case side, the through-hole 30a, and the through-hole 30b (FIG. 5) are provided.

The outgas is discharged to the internal space side, and is discharged from the through-hole 30b provided in the cover. If the outgas is not discharged, internal pressure is applied, stress is applied to the sealing material, and airtightness of the internal space cannot be maintained. The size of the through-hole 30b is a minute size that can be molded in a punching step of press-molding, and causes an outgas to be discharged.

The outer shape of the electronic control device has a relatively large size of 240 mm×160 mm, and in the low height electronic control device, the through-hole 30a and the through-hole 30b for discharge are provided at about 5 locations so that outgas is easily discharged at the time of curing. The pressure in the internal space and the atmospheric pressure at the time of assembly are desirably the same.

As shown in FIG. 6, in order to prevent salt water from entering through the through-hole 30b for discharge provided in the cover, a seal tape 70 having high adhesive power is attached as a lid portion. Furthermore, a label 80 for protecting the seal tape 70 is attached thereon. That is, the cover 30 (housing) includes the label 80 attached to the cover 30 (housing) so as to cover the seal tape 70. The label 80 is attached to identify a product model, a production history, and the like.

The label 80 is made of, for example, a polyester film, and is preferably made of a material having water resistance, oil resistance, and heat resistance. The adhesive used for the label 80 is, for example, an acrylic adhesive, but is not limited thereto. The label 80 has an effect of not only hiding the seal tape 70 from the viewpoint of design, but also reinforcing the function (waterproof, dustproof, etc.) of the seal tape 70. FIG. 6 illustrates the middle of assembly before the label 80 is attached from above.

When the surface temperature of the cover is cooled from higher than or equal to 100° C. to about 25° C. after the sealing material 40 is cured by applying heat, the seal tape 70 is attached without peeling due to air entrainment or the like by a uniform pressing pressure with a roller or the like. The pressing pressure is about 50 N. The size of the seal tape 70 is about 20 mm×15 mm, and is sufficiently large with respect to the through-hole 30b to prevent entering of salt water or the like into the metal layer 32 and the plating layer 33 of the iron-based base material, and the internal space 11 is completely sealed. The adhesive force of the seal tape can withstand a pressure of about 50 kPa to 85 kPa. The shape of the seal tape may be a square shape, a rectangular shape, a circular shape, or an elliptical shape as long as the seal tape can close the through-hole 30a and maintain the adhesive force.

An exposed site 32a for exposing the plating layer 33 and the metal layer 32 is provided at the periphery of the through-hole 30b. The processing method for exposing may be milling, processing of breaking plating during press molding, drawing repeatedly a plurality of times, or the like. An exposed site 32a (exposed portion) is provided at the time of molding the cover 30. Since the metal layer 32 of the iron-based base material is exposed, the surface turns red when oxidized. Red rust 32b is generated on the outermost surface of the processed portion.

In other words, the electronic control device 1 includes the cover 30 (housing). The cover 30 (housing) includes at least a metal layer 32 made of metal, a plating layer 33 that coats an outer surface of the metal layer 32, an exposed site 32a that exposes the metal layer 32 from a part of the plating layer 33, and a seal tape 70 (lid portion) that covers the metal layer 32 exposed from the exposed site 32a. The seal tape 70 is configured to cover the metal layer 32 exposed by the exposed site 32a by being attached to the cover 30 (housing).

As a result, for example, the oxidation state of the cover 30 (housing) can be easily confirmed by the exposed site 32a before assembling the electronic control device. In addition, when the seal tape is peeled off, the exposed site 32a serves as an indicator of temperature and humidity, and it is possible to determine in which environment the seal tape has been stored.

In the present example, the cover 30 (housing) includes the through-hole 30b, and the through-hole 30b and the exposed site 32a are covered with one seal tape 70. This can reduce the number of steps of attaching the seal tape 70. The through-hole 30b illustrated in FIG. 6 is provided in the region (central portion) of the exposed site 32a. As a result, for example, the positioning at the time of machining the exposed site 32a and the through-hole 30b with the machine tool merely needs to be performed only once.

FIG. 5 is a cross-sectional view of a single cover before assembly. When red rust 32b is generated, the storage status of the cover 30 can be grasped, and the operator can determine visually or by an image whether or not the cover 30 can be used before assembly. The outermost layer of the cover 30 is the chemical conversion treatment layer 34 and subsequently the plating layer 33, but even if these layers are oxidized, they cannot be easily determined visually. However, it can be visually determined if iron of the base material is oxidized.

When the red rust 32b is generated, it is not put into the assembly line. This is a state in which oxidation of both the chemical conversion treatment layer 34 and the plating layer 33 is advanced. When the outermost chemical conversion treatment layer 34 and the plating layer 33 are oxidized, the silicone-based sealing material 40 can be adhered mainly by hydrogen bonding, but moisture and the like permeate through the silicone-based sealing material 40 after adhesion, and the hydrogen bonding is broken at the interface of the adhering portion, resulting in interfacial peeling. When the surface is oxidized, the sealing material 40 is easily peeled off, where when moisture or heat is applied, the adhesive force is easily reduced, and in an environment of an engine room in which an internal pressure change is 50 kPa to 85 kPa and in an electronic control device in which the size is increased, the reduction in the adhesive force of the sealing portion cannot be ignored. In addition, before assembly, it is possible to determine whether or not it can be used according to the degree of oxidation of the plating layer under the chemical conversion treatment layer.

The substrate in the vicinity of the through-hole for discharge outside the cover is exposed, and the base material of the metal layer is processed to be thin (e.g., milling), so that an oxide film can be removed, where whether red rust is generated can be confirmed visually or by an image before assembly, and there is an advantage that the storage environment can be predicted visually without including a storage such as a desiccator when stored for a long period of time. The exposed site 32a serves as an indicator for grasping temperature and humidity according to the generation state of the red rust 32b.

First Modified Example

Figure 7:
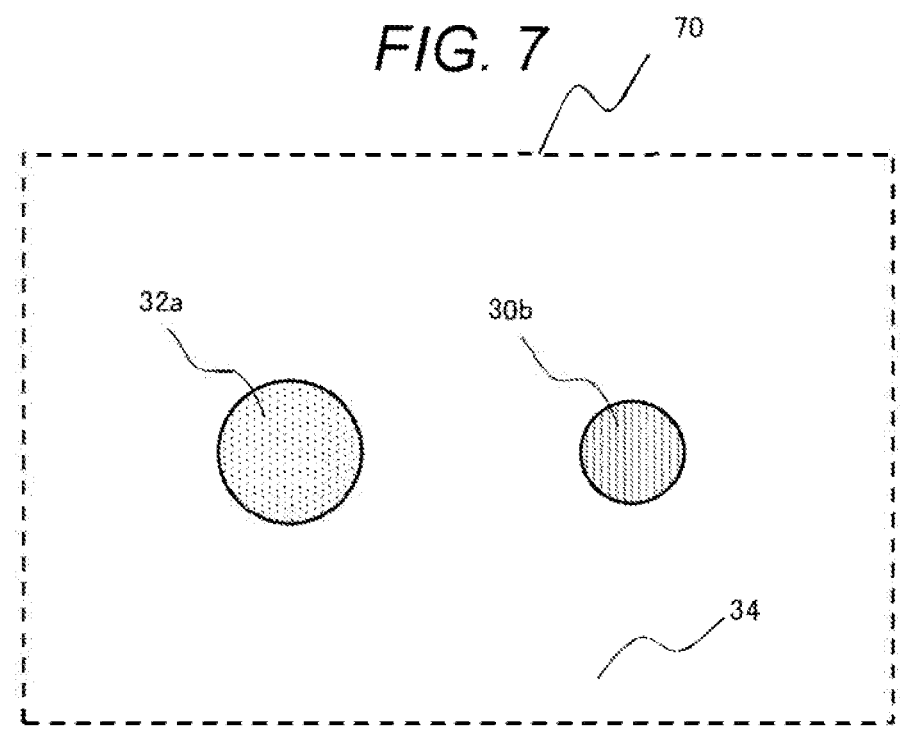
FIG. 7 is a plan view of a main part of a cover according to a first modified example.

FIG. 7 is a plan view of a main part of a cover 30 (housing) according to a first modified example. In the present modified example, the through-hole 30b is provided outside the region of the exposed site 32a. As a result, the region of the exposed site 32a becomes wide, and visual confirmation becomes easy. In addition, there is no possibility that contamination such as plating residue generated at the time of processing the exposed site 32a falls on the board.

Second Modified Example

Figure 8:
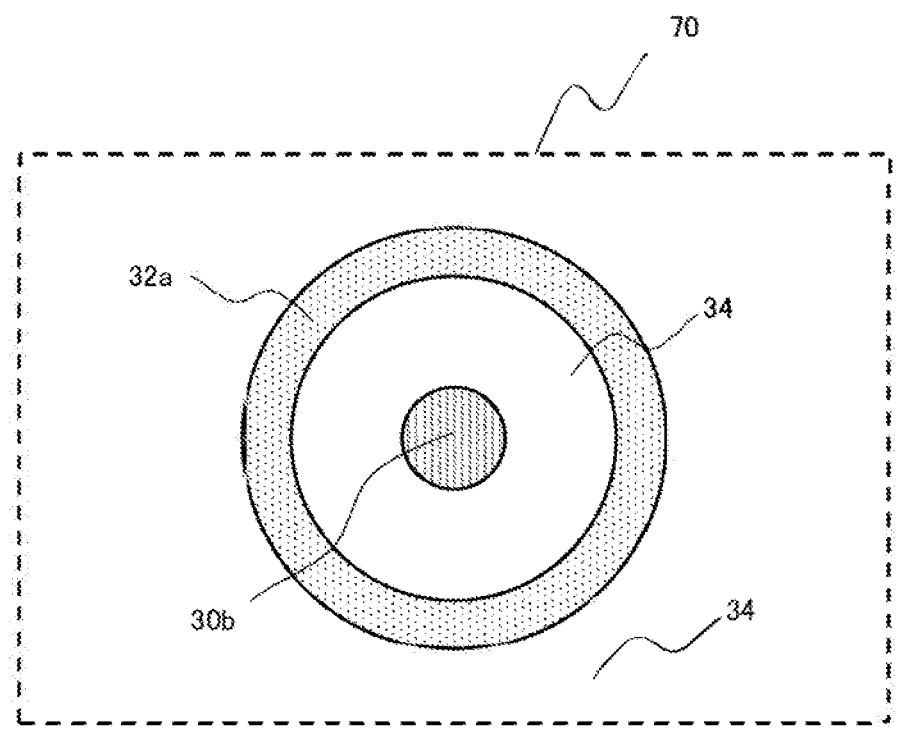
FIG. 8 is a plan view of a main part of a cover according to a second modified example.

FIG. 8 is a plan view of a main part of a cover 30 (housing) according to a second modified example. In the present modified example, the exposed site 32a has a circular ring shape and is provided around the through-hole 30b. As a result, the region of the exposed site 32a becomes wide, and visual confirmation becomes easy. In addition, there is no possibility that contamination such as plating residue generated at the time of processing the exposed site 32a falls on the board. Furthermore, positioning at the time of machining the exposed site 32a and the through-hole 30b by the machine tool merely needs to be performed once.

According to the present example, as compared with the conventional electronic control device, an electronic control device can be provided that exposes the plating layer in the vicinity of the discharge hole, determines the oxidation state before assembling the cover, can confirm the influence of long-term storage, and can be completely airtight without reducing the adhesive force of the sealing material in the wet environment.

(Manufacturing Method)

Figure 9:
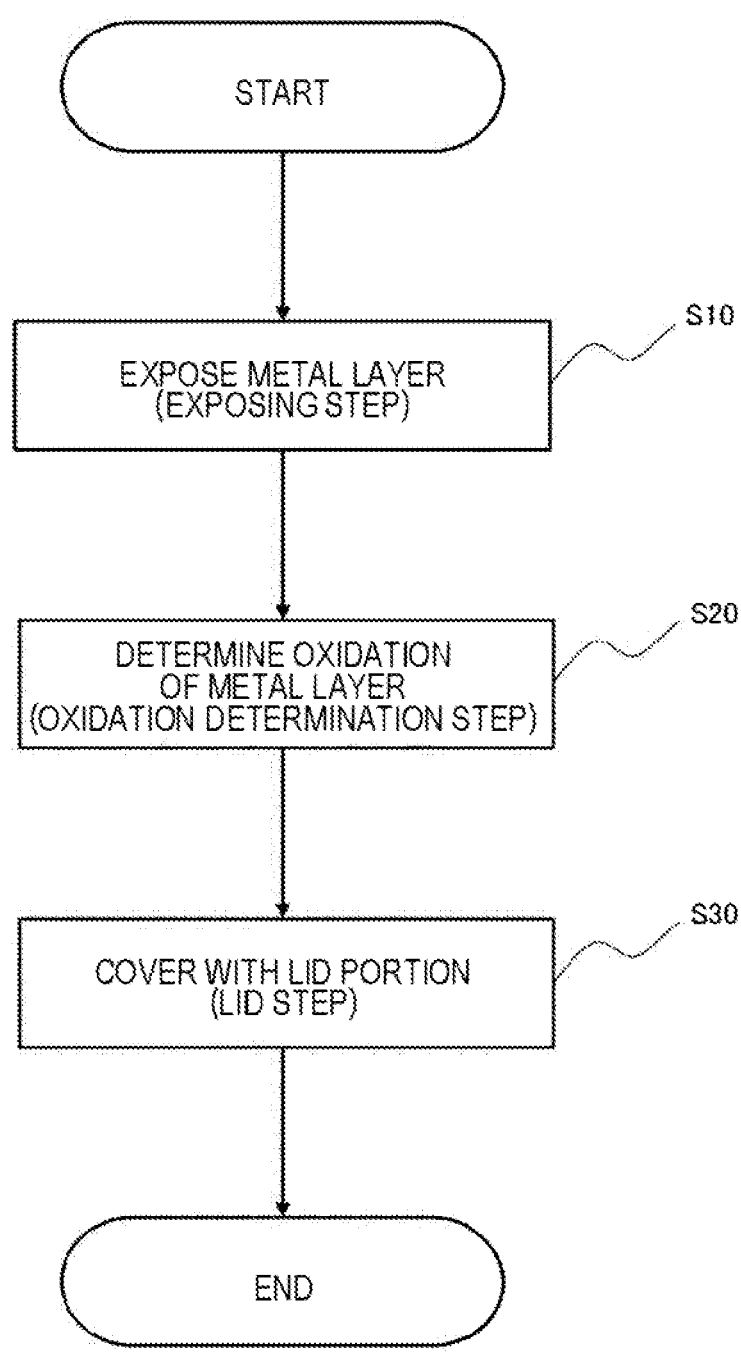
FIG. 9 is a flowchart showing only characteristic parts in the method for manufacturing the electronic control device.

Next, only characteristic parts of the method for manufacturing the electronic control device 1 according to the present example will be described with reference to FIG. 9. Note that the subject of each operation is, for example, a machine tool, a robot, a human, or the like. A machine such as a machine tool or a robot includes, for example, a processor, a memory, an actuator, and the like. The processor controls the actuator according to a program stored in the memory to implement a predetermined function.

The machine tool exposes the metal layer 32 from a part of the plating layer 33 of the cover 30 (housing) by milling (S10: exposing step).

The human confirms the oxidation state of the exposed site 32a visually or by an image, and determines oxidation of the metal layer 32 exposed by the exposed site 32a (S20: oxidation determination step). In the present example, as a simple method, a human confirms the oxidation state (red rust) of the exposed site 32a visually or by an image, but a processor may confirm the oxidation state (red rust) of the exposed site 32a from an image captured by an imaging device (image recognition), and determine the oxidation of the metal layer 32 from a correspondence table or the like of the color of the exposed site 32a and the degree of oxidation.

The robot covers the metal layer 32 exposed by the exposed site 32a with the seal tape 70 (lid portion) (S30: lid step). That is, after the oxidation determination step (S20), the robot attaches the seal tape 70 as a lid portion to the cover 30 (housing) so as to cover the metal layer 32 exposed by the exposed site 32a.

As described above, according to the present example, the oxidation state of the housing can be easily checked.

Note that the present invention is not limited to the embodiments described above, and includes various modified examples. For example, the examples described above have been described in detail for the sake of easy understanding of the present invention, and are not necessarily limited to those having all the described configurations. In addition, a part of the configuration of a certain example can be replaced with a configuration of another example (modified example), and the configuration of a certain example can be added with the configuration of another example. Furthermore, for a part of the configuration of each example, other configurations can be added, deleted, and replaced.

In the above example, the exposed site 32a for confirming an oxidation state, the through-hole 30b for discharging outgas, the seal tape 7 for waterproofing, and the label 80 for displaying product information are arranged near the short side of the rectangular cover 30 (housing) having an empty space, but may be arranged near the long side. However, these components are preferably disposed in a portion having a small curvature (a portion away from the central portion) when the cover 30 (housing) is deformed by the internal pressure.

Examples of the present invention may have the following aspects.

(1). An electronic control device including a case; and a cover that covers the case, where the cover includes a metal layer made of metal; a plating layer that coats an outer surface of the metal layer; an exposed site that exposes the metal layer from a part of the plating layer; and a lid portion that covers the metal layer exposed by the exposed site.

(2). In the electronic control device of (1), the lid portion is formed of a seal tape.

(3). In the electronic control device of (1) or (2), the plating layer is formed of Zn, Al, or Mg.

(4). In the electronic control device according to any one of (1) to (3), a chemical conversion treatment layer that coats an outer surface of the plating layer is provided.

(5). In the electronic control device according to any one of (1) to (5), the seal tape is attached to a surface of the chemical conversion treatment layer or the plating layer to cover the metal layer.

(6). A method for manufacturing an electronic control device including a case and a cover that covers the case, the cover including a metal layer made of metal and a plating layer that coats an outer surface of the metal layer, the method including exposing the metal layer from a part of the plating layer; and covering the metal layer exposed by the exposed site with a lid portion.

(7). In the electronic control device of (6), an oxidation state of the processed portion of the stored molded product is confirmed visually or by an image to determine oxidation of plating, and after the determination, a seal tape is attached to the processed portion.

In the examples described above, for example, a discharge hole for discharging outgas is provided in the cover, and the chemical conversion treatment layer and the plating layer in the vicinity of the discharge hole are peeled off on the outer side of the cover to expose the iron of the substrate. Since there are variations in the thickness of the base material and the thickness of plating, not only the plating layer but also the surface of the base material is thinly removed. Iron without an oxide film turns red when oxidized, and can be determined visually or by an image, where a cover in which red rust is not generated among the stored covers is put into assembly, and after curing of the seal adhesive, outgas is discharged, and then a lid member such as a seal tape is attached so as to close the discharge hole and the substrate exposed portion for airtightness.

In other words, the electronic control device of the present example has an advantage that the oxide film can be removed by exposing the substrate in the vicinity of the discharge hole on the outer side of the cover and thinly processing the base material, where whether red rust is generated can be confirmed visually or by an image before assembly, and the storage environment can be predicted visually without including a storage such as a desiccator when stored for a long period of time. It serves as an indicator for grasping temperature and humidity. Furthermore, there is an advantage that a lid member such as a seal tape is attached to close the discharge hole and the substrate exposed portion, prevent corrosion of the cover material, withstand environment resistance of the engine room, and achieve airtightness without decreasing adhesive force of the seal adhesive material. Since the outer side of the cover is processed, there is also an advantage that foreign matter such as plating residue does not fall on the printed wiring board at the time of assembly. Furthermore, since it is not a separate body as in the known example but is integrated with a product, there is an advantage that the cost can be suppressed.

REFERENCE SIGNS LIST 1 electronic control device
10 printed wiring board
11 internal space
20 case
21 frontage
21a convex portion
23 through-hole
24 heat dissipation fin
30 cover
30a through-hole
30b through-hole
31 end portion
32 metal layer
32a exposed site
32b red rust
33 plating layer
34 chemical conversion treatment layer
40 sealing material
41 sealing material
50 screw
51 screw
60 connector
61 housing
61a recessed shape
62 housing groove
63 terminal
64 potting material
70 seal tape
80 label

The invention claimed is:

1. An electronic control device comprising:
a housing, wherein the housing includes,
   a metal layer made of metal,
   a plating layer that coats an outer surface of the metal layer,
   an exposed site that exposes the metal layer from a part of the plating layer,
   a lid portion that covers the exposed metal layer at the exposed site, and
   the metal layer is exposed directly to the lid at the exposed site.

2. The electronic control device according to claim 1, wherein
the lid portion is configured by a seal tape.

3. The electronic control device according to claim 1, wherein
the plating layer contains zinc, aluminum or magnesium.

4. The electronic control device according to claim 1, wherein
the housing includes a chemical conversion treatment layer that coats an outer surface of the plating layer.

5. The electronic control device according to claim 2, wherein
the seal tape is configured to cover the exposed metal layer by the exposed site by being attached to the housing.

6. The electronic control device according to claim 5, wherein
the housing includes a through-hole; and
the through-hole and the exposed site are covered with a sheet of the seal tape.

7. The electronic control device according to claim 6, wherein
the through-hole is provided in a region of the exposed site.

8. The electronic control device according to claim 6, wherein
the through-hole is provided outside the region of the exposed site.

9. The electronic control device according to claim 8, wherein
the exposed site is a circular ring shape, and is provided around the through-hole.

10. The electronic control device according to claim 2, wherein
the housing includes a label attached to the housing so as to cover the seal tape.

11. A method for manufacturing an electronic control device according to claim 1, the method comprising:
  an exposing step of exposing the metal layer from a part of the plating layer; and
  a lid step of covering the exposed metal layer by the exposed site with the lid portion.

12. The method for manufacturing the electronic control device according to claim 11, further comprising:
  an oxidation determination step of confirming an oxidation state of the exposed site visually or by an image and determining oxidation of the exposed metal layer by the exposed site; wherein
  the lid step is a step of attaching a seal tape as the lid portion to the housing to cover the exposed metal layer by the exposed site after the oxidation determination step.

* * * * *